United States Patent
Held et al.

(10) Patent No.: US 11,280,871 B2
(45) Date of Patent: Mar. 22, 2022

(54) METHOD OF ABSOLUTE PHASE CALIBRATION AS WELL AS CALIBRATION SYSTEM

(71) Applicant: Rohde & Schwarz GmbH & Co. KG, Munich (DE)

(72) Inventors: Werner Held, Munich (DE); Jan-Patrick Schultheis, Munich (DE); Jakob Hammer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 53 days.

(21) Appl. No.: 16/712,853

(22) Filed: Dec. 12, 2019

(65) Prior Publication Data

US 2021/0181289 A1 Jun. 17, 2021

(51) Int. Cl.
*G01R 35/00* (2006.01)
*G01R 27/28* (2006.01)

(52) U.S. Cl.
CPC ........... *G01R 35/005* (2013.01); *G01R 27/28* (2013.01)

(58) Field of Classification Search
CPC .............................. G01R 35/005; G01R 27/28
See application file for complete search history.

(56) References Cited

U.S. PATENT DOCUMENTS

| | | | | |
|---|---|---|---|---|
| 4,138,646 A * | 2/1979 | Parato | ................... | H03G 3/3052 455/226.1 |
| 5,089,782 A * | 2/1992 | Pike | ....................... | G01R 27/28 324/612 |
| 2011/0019773 A1 * | 1/2011 | Van De Beek | ..... | H04L 27/0014 375/340 |
| 2014/0306719 A1 * | 10/2014 | Dunsmore | ........... | G01R 35/005 324/601 |
| 2017/0153280 A1 * | 6/2017 | Mikulka | ................ | G01R 35/00 |

OTHER PUBLICATIONS

Ferrero, A., and Pidani, U., "Two-Port Network Analyzer Calibration Using an Unknown "Thru"," IEEE Microwave and Guided Wave Letters 2(12):505-507, Dec. 1992.
Zhang, Y., et al., "Study on Absolute Calibration Methods for Mixed-Based NVNA1," 2010 Conference on Precision Electromagnetic Measurements, Jun. 13-18, 2010, 2 pages.
Van Den Broeck, T., and Verspecht, J., "Calibrated Vectorial Nonlinear-Network Analyzers," IEEE MTT-S International Microwave Symposium Digest, May 23-27, 1994, 4 pages.

* cited by examiner

*Primary Examiner* — Akm Zakaria
(74) *Attorney, Agent, or Firm* — Christensen O'Connor Johnson Kindness PLLC

(57) ABSTRACT

A method of absolute phase calibration of at least a first port of a test and measurement equipment, comprising: providing the test and measurement equipment having the first port to be calibrated; providing a calibration mixer having a first port, a second port and a local oscillator port; providing at least one phase reproducible source that outputs a local oscillator signal; and performing at least two UOSM measurements at the first port of the test and measurement equipment, wherein at least one of the at least two UOSM measurements is performed with a frequency shift from a first frequency to a second frequency by using the calibration mixer. Furthermore, a calibration system is described.

14 Claims, 3 Drawing Sheets

| Frequency | f_0 | f_1 | f_2 | f_3 | ... |
|---|---|---|---|---|---|
| Phase Cal. | 0 | $\Delta\varphi\_01 + d$ | $\Delta\varphi\_01 + \Delta\varphi\_12 + 2d$ | $\Delta\varphi\_01 + \Delta\varphi\_12 + \Delta\varphi\_23 + 3d$ | ... |

METHOD OF ABSOLUTE PHASE CALIBRATION AS WELL AS CALIBRATION SYSTEM

TECHNICAL FIELD

Embodiments of the present disclosure relate to a method of absolute phase calibration of at least a first port of a test and measurement equipment. Further, embodiments of the present disclosure relate to a calibration system for absolute phase calibration.

BACKGROUND

Test and measurement equipment, also called measurement and analyzing devices, are used to measure characteristics and/or properties of a device under test. Such a test and measurement equipment may relate to a (vector) network analyzer, abbreviated by (V)NA. For ensuring an accurate measurement of the device under test, the respective test and measurement equipment has to be calibrated previously such that a maximum of precision is ensured when measuring the device under test.

Typically, the system error corrections known in the state of the art only provide a relative calibration between different ports of the test and measurement equipment. The procedure used in the state of the art is also called S-parameter calibration procedure. In this specific case, the phase relation of individual wave quantities at different frequencies remains unknown.

Therefore, it is also known in the state of the art to use a comb generator as a phase reference, which inter alia allows to calibrate the phase of the test and measurement equipment in an absolute manner. However, comb generators are expensive such that the entire calibration system as well as the respective procedure are expensive. Moreover, comb generators typically provide only low power calibration signals resulting in a bad signal to noise ratio (SNR).

Accordingly, there is a need for a precise and cost-efficient way to calibrate a test and measurement equipment with respect to phase in an absolute manner.

SUMMARY

Embodiments of the present disclosure provide a method of absolute phase calibration of at least a first port of a test and measurement equipment. The method, in an embodiment, comprises the steps of:

providing the test and measurement equipment having the first port to be calibrated;

providing a calibration mixer having a first port, a second port and a local oscillator port;

providing at least one phase reproducible source that outputs a local oscillator signal; and performing at least two UOSM measurements at the first port of the test and measurement equipment, wherein at least one of the at least two UOSM measurements is performed with a frequency shift from a first frequency to a second frequency by using the calibration mixer.

Accordingly, a calibration mixer is used instead of a comb generator in order to perform an absolute calibration of the test and measurement equipment. For this absolute phase calibration, it is required to determine the respective phases of a receiving port of the test and measurement equipment for a certain frequency and its harmonics. Thus, the first port of the test and measurement equipment, namely the port to be calibrated, relates to a receiving port that receives the signal provided by the calibration mixer.

Generally, the costs for calibration of the test and measurement equipment are reduced, as the same device as for other calibrations can be used for performing the absolute phase calibration of the test and measurement equipment.

Further, a significantly higher signal to noise ratio (SNR) can be obtained by performing the respective absolute phase calibration method, as high power calibration signals may be used. By using the calibration mixer, it is also ensured that a higher flexibility with respect to the calibrated frequency grid can be obtained.

The different ports of the calibration mixer, namely the first port and the second port, may relate to a radio frequency port (RF port) as well as an intermediate frequency port (IF port). The respective ports define the calibration positions.

The UOSM measurements are assigned to a UOSM calibration procedure that is generally known in the state of the art. For instance, different calibration standards, namely Open, Short, Match, are used at the respective port of the test and measurement equipment for calibration purposes. The different calibration standards are interconnected between the calibration mixer and the port to be calibrated. However, the respective UOSM calibration procedure can also be performed by a single calibration device providing the respective calibration standards or at least their functionalities. In some embodiments, the calibration mixer corresponds to such a calibration device.

In any case, different measurements may be performed during each UOSM measurement, for instance the ones assigned to the calibration standards. Typically, different error terms are derived by the UOSM measurements for each signal direction, namely reflection tracking, source match, directivity, and load match.

Furthermore, the phase reproducible source outputting the local oscillator signal ensures that the local oscillator signal does not provide any phase deviations between the different measurements.

The test and measurement equipment may comprise a second port that also provides a phase reproducible signal. Put differently, the second port is assigned with a phase reproducible source. The second port of the test and measurement equipment may be connected with the calibration mixer during the respective measurements.

The first port and/or the second port of the test and measurement equipment may be generally configured to drive and/or receive. Hence, the port(s) can be used in a bidirectional manner.

However, the first port to be calibrated may be used as a receiving port during the respective calibration. Put differently, the first port of the test and measurement equipment may relate to a receiving port during the calibration.

The first port to be calibrated of the test and measurement equipment covers the entire frequency range in both signal directions (bidirectional manner), namely for source and receiver.

In some embodiments, each of the at least two UOSM measurements is performed with a frequency shift from a first frequency to a second frequency by using the calibration mixer. The first frequency or rather the second frequency may relate to an intermediate frequency between two intended frequencies.

In other words, at least two intended frequencies, labelled with $f_n$ and $f_{n+1}$, are provided at the port to be calibrated, namely the first port of the test and measurement equipment.

The calibration mixer, however, may receive a signal with a frequency being an intermediate frequency between the two intended frequencies. Therefore, the intermediate frequency may be labelled by $f_{n+1/2}$.

Moreover, the calibration mixer may also output signals with the intermediate frequency $f_{n+1/2}$ such that those signals are provided at the port to be calibrated, namely the first port of the test and measurement equipment. In this specific procedure, more than two UOSM measurements are required for absolute phase calibration of that port.

According to an aspect, a phase difference is determined based on the at least two UOSM measurements. Each UOSM measurement provides phase information that is used to determine the respective phase difference between the phases obtained. In other words, the at least two different UOSM measurements performed yield the respective phase difference at the port to be calibrated, namely the first port of the test and measurement equipment, for pairs of different (intended) frequencies.

Generally, the measurement of the phase difference may be performed by different procedures.

For instance, at least one of up-conversion, down-conversion and LSB-mixing is done when performing the frequency shift. Hence, the first frequency may be a lower frequency with respect to the second frequency such that an up-conversion takes place. In a different approach, the first frequency may be a higher frequency with respect to the second frequency such that a down-conversion may take place. Furthermore, a lower side band mixing (LSB-mixing) may take place. All these different procedures provide the respective frequency shift.

In general, the frequency shift may be realized by using the calibration mixer and the local oscillator signal. Thus, the calibration mixer having the radio frequency port (RF port) as well as the intermediate frequency port (IF port) is fed with a respective signal that is shifted by the calibration mixer that also receives the local oscillator signal such that the signal outputted by the calibration mixer corresponds to a signal shifted in frequency.

According to an aspect, the first port of the calibration mixer is connected with the first port of the test and measurement equipment and/or the local oscillator port of the calibration mixer is connected with the at least one phase reproducible source and/or a second port of the calibration mixer is connected with another phase reproducible source, for example a second port of the test and measurement equipment. Thus, the calibration mixer may be connected with both ports of the test and measurement equipment such that both ports of the test and measurement equipment are used as a source and a receiver for the respective signals, respectively. The signals are forwarded via the calibration mixer ensuring the respective frequency shift during the UOSM measurement(s).

In some embodiments, respective calibration standards may be used during the UOSM measurements, namely an open calibration standard, a short calibration standard as well as a match calibration standard, also called load calibration standard. Alternatively, a calibration device may be used in order to perform the respective UOSM measurements at the first port of the test and measurement equipment, namely the port to be calibrated. In some embodiments, the calibration mixer encompasses the UOSM calibration device already.

According to another aspect, at least two different frequencies are used during the at least two UOSM measurements at the first port to be calibrated. The first port to be calibrated may relate to the receiving port. Thus, the calibration mixer used provides two different frequencies at the port to be calibrated. Accordingly, a phase difference can be determined.

Frequency shifts may be performed during the at least two UOSM measurements, wherein the frequency shifts relate to an up-conversion and a down-conversion, respectively. Thus, both UOSM measurements relate to different conversions that are done by the calibration mixer.

According to an aspect, a through is connected with the first port to be calibrated. The through is interconnected between the first port and the second port of the test and measurement equipment. Thus, a non-frequency converting phase measurement may take place by the through, as the through replaces the calibration mixer in the respective setup.

In some embodiments, the through is used for non-frequency converting measurements. Accordingly, the frequency of the signal provided is not shifted while being forwarded to the port to be calibrated. Hence, the input frequency relates to the frequency at the first port of the test and measurement equipment, namely the port to be calibrated.

The calibration mixer may be reciprocal at least for the frequencies used for absolute phase calibration. This means that the output of the calibration mixer in both signal directions is similar with respect to phase (and amplitude). Therefore, the first port of the calibration mixer and the second port of the calibration mixer may be interchanged with each other during the respective measurements without any impact on the respective measurements due to the reciprocity of the calibration mixer.

For instance, the test and measurement equipment comprises the at least one phase reproducible source, for example both phase reproducible sources assigned to the local oscillator port and the second port of the calibration mixer. Thus, three different ports of the test and measurement equipment may be used for calibration purposes. Put differently, the calibration mixer is completely connected with the test and measurement equipment. The test and measurement equipment outputs the local oscillator signal that is forwarded to the calibration mixer for shifting the frequency of an input signal of the calibration mixer that was provided by the second port of the test and measurement equipment, namely the other phase reproducible source. Therefore, the second port of the test and measurement equipment may also relate to a phase reproducible source.

In some embodiments, the test and measurement equipment is a vector network analyzer. Typically, a vector network analyzer is used to measure characteristics of a device under test. Therefore, it is necessary to calibrate the test and measurement equipment correctly.

Further, embodiments of the present disclosure provide a calibration system for absolute phase calibration. In an embodiment, the system comprises:

a test and measurement equipment having a first port to be calibrated;

a calibration mixer having a first port, a second port and a local oscillator port;

at least one phase reproducible source that outputs a local oscillator signal, wherein the calibration system is configured to perform at least two UOSM measurements at the first port of the test and measurement equipment, wherein at least one of the at least two UOSM measurements is performed with a frequency shift from a first frequency to a second frequency by using the calibration mixer.

According to an aspect, in a first setup, the first port of the calibration mixer is connected with the first port of the test and measurement equipment. The second port of the calibration mixer is connected with a second port of the test and measurement equipment. The local oscillator port of the calibration mixer is connected with the phase reproducible source. The first setup relates to the initial setup when performing the respective UOSM measurements.

Then, the respective interconnections are disconnected, for example the ones of the calibration mixer. In case of a calibration device, the respective calibration device providing a (known) through calibration standard may be maintained connected with the first port of the test and measurement equipment.

Moreover, in a second setup, a (known) through may be interconnected between the first port of the test and measurement equipment and a second port of the test and measurement equipment. Hence, the calibration mixer is disconnected from the test and measurement equipment. Thus, it is also possible to perform non-frequency converting measurements by the through interconnected between the first port and the second port of the test and measurement equipment.

In case of using the calibration device, the calibration device having the (known) through calibration standard may be connected with the first port of the test and measurement equipment. However, the calibration mixer is disconnected for testing purposes.

Generally, a calibration kit having several calibration standards may be provided. The calibration kit may comprise the respective UOSM standards used when performing the respective UOSM measurements.

Alternatively, the calibration device is provided that provides the respective functionalities of the calibration standards. For instance, the calibration mixer encompasses the calibration device.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
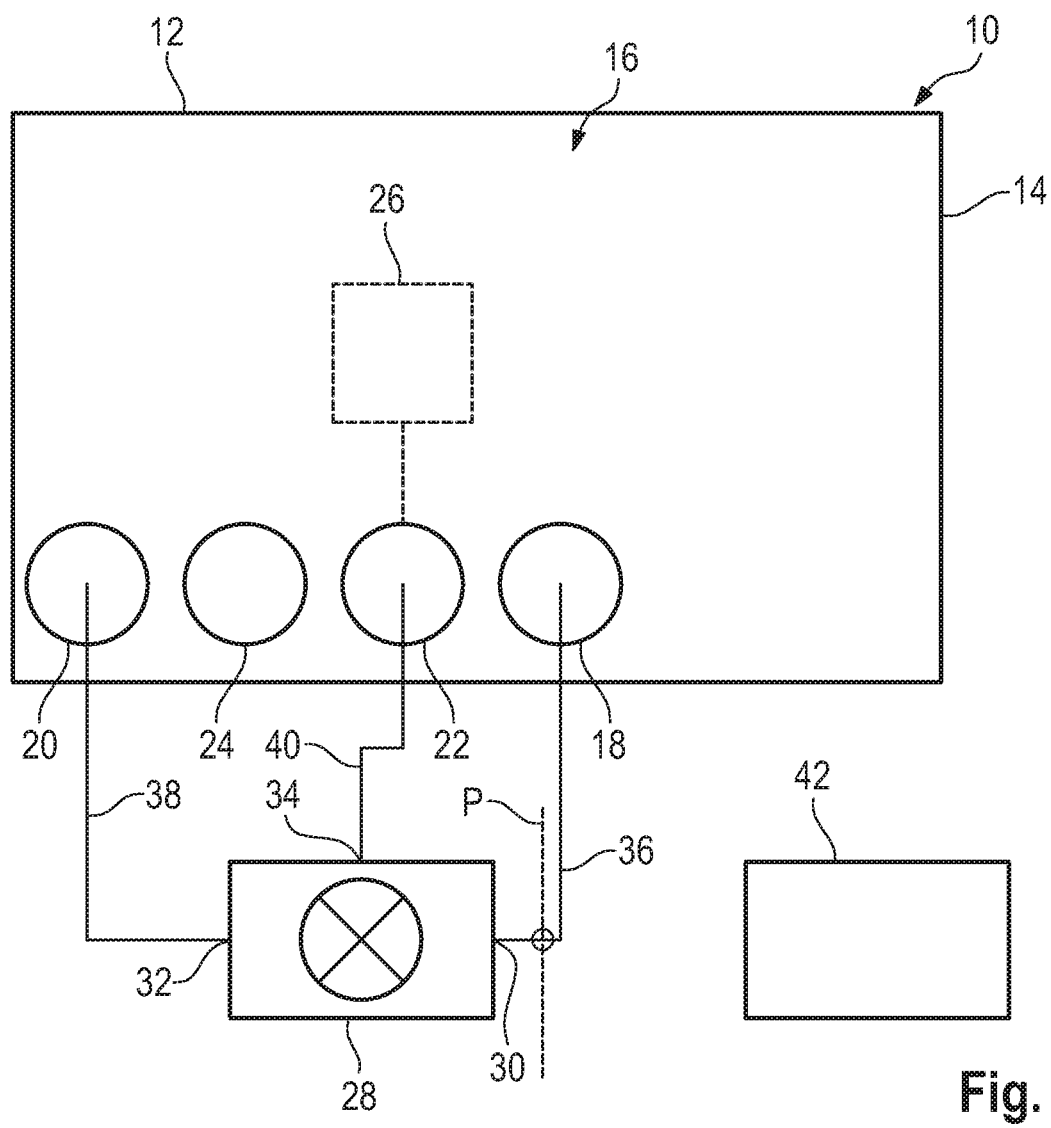
FIG. 1 schematically shows an overview of a representative calibration system according to the present disclosure, which is used to perform a method of absolute phase calibration according to the present disclosure.
Figure 2:
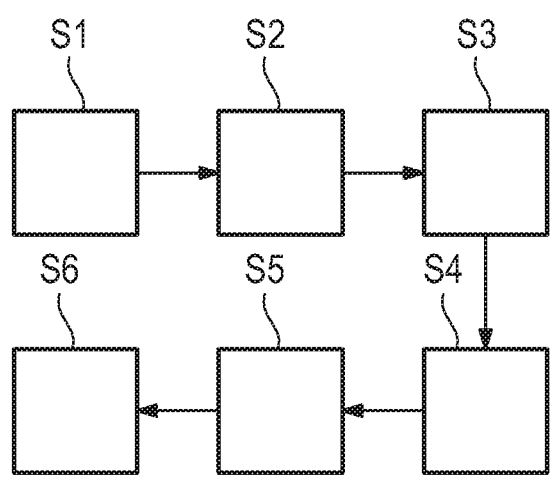
FIG. 2 schematically shows an overview illustrating a representative method of absolute phase calibration according to the present disclosure.

In FIG. 1, a calibration system 10 is shown that comprises a test and measurement equipment 12, which has to be calibrated by a method as illustrated in FIG. 2.

In the shown embodiment, the test and measurement equipment 12 is established by a vector network analyzer (VNA). The test and measurement equipment 12 comprises a housing 14 that encompasses internal measurement and analyzing components 16.

Further, the test and measurement equipment 12 comprises a first port 18, a second port 20, a third port 22 and a fourth port 24. The respective ports 18-24 are located at a front-end of the test and measurement equipment 12. Each of the ports 18-24 may be calibrated in a subsequent manner in order to calibrate the entire test and measurement equipment 12

In the shown embodiment, the test and measurement equipment 12 comprises a phase reproducible source 26 that is assigned to the third port 22. In some embodiments, the phase reproducible source 26 may be established by an integrated local oscillator.

Thus, a local oscillator signal is outputted by the third port 22 assigned to the phase reproducible source 26. The local oscillator signal can be used for the absolute calibration method described later.

In addition, the calibration system 10 comprises a calibration mixer 28 that has a first port 30, a second port 32 and a local oscillator port 34. In the shown setup corresponding to an initial setup, the calibration mixer 28 is connected with the first port 18 of the test and measurement equipment 12 via a first cable 36 that is also connected with the first port 30 of the calibration mixer 28. Further, the calibration mixer 28 is connected with the second port 20 of the test and measurement equipment 12 via a second cable 38 that is also connected with the second port 32 of the calibration mixer 28.

In addition, a third cable 40 is interconnected between the local oscillator port 34 of the calibration mixer 28 and the third port 22 of the test and measurement equipment that is assigned to the phase reproducible source 26.

Generally, the first port 30 and the second port 32 of the calibration mixer 28 may relate to a radio frequency port (RF port) as well as an intermediate frequency port (IF port) depending on the respective signals forwarded to the calibration mixer 28 and outputted by the calibration mixer 28.

In the shown embodiment, the calibration mixer 28 is established as a calibration device that can be used for UOSM measurements.

Alternatively, a calibration kit comprising several calibration standards for UOSM measurements may be provided, which are interconnected between the port to be calibrated and the calibration mixer 28.

In addition, the calibration system 10 may comprise a (known) through 42 that can be interconnected between the first port 18 of the test and measurement equipment 12 and the second port 20 of the test and measurement equipment 12, for example instead of the calibration mixer 28.

This will be described hereinafter with reference to FIGS. 2 and 3, in which a flow-chart and different techniques are shown. The flow-chart of FIG. 2 illustrates the steps of the method of absolute phase calibration according to the present disclosure.

In the shown embodiment, an absolute phase calibration of the first port 18 of the test and measurement equipment 12 shall take place. This becomes obvious by the calibration point P in FIG. 1, which is assigned to the first port 18 of the test and measurement equipment 12.

In a first step S1, the calibration mixer 28 as well as the test and measurement equipment 12 having the phase reproducible source 26 are provided.

In a second step S2, the test and measurement equipment 12 and the calibration mixer 28 are connected with each other as shown in FIG. 1 in order to establish the initial or rather first setup.

In a third step S3, at least two UOSM measurements are performed at the port to be calibrated, namely the first port 18 of the test and measurement equipment 12. During these UOSM measurements, at least one measurement is performed with a frequency shift from a first frequency to a second frequency by using the calibration mixer 28. This frequency shift can be performed in different ways, which are shown in the overview of FIG. 3 in more detail and will be described later.

In a fourth step S4, a phase difference is determined based on the at least two UOSM measurements.

In a fifth step S5, correction parameters are calculated based on the phase difference determined.

In a sixth step S6, the respective correction parameters calculated are applied on the test and measurement equipment 12.

The respective routine can be repeated for all ports 18-24 of the test and measurement equipment 12.

Figure 3:
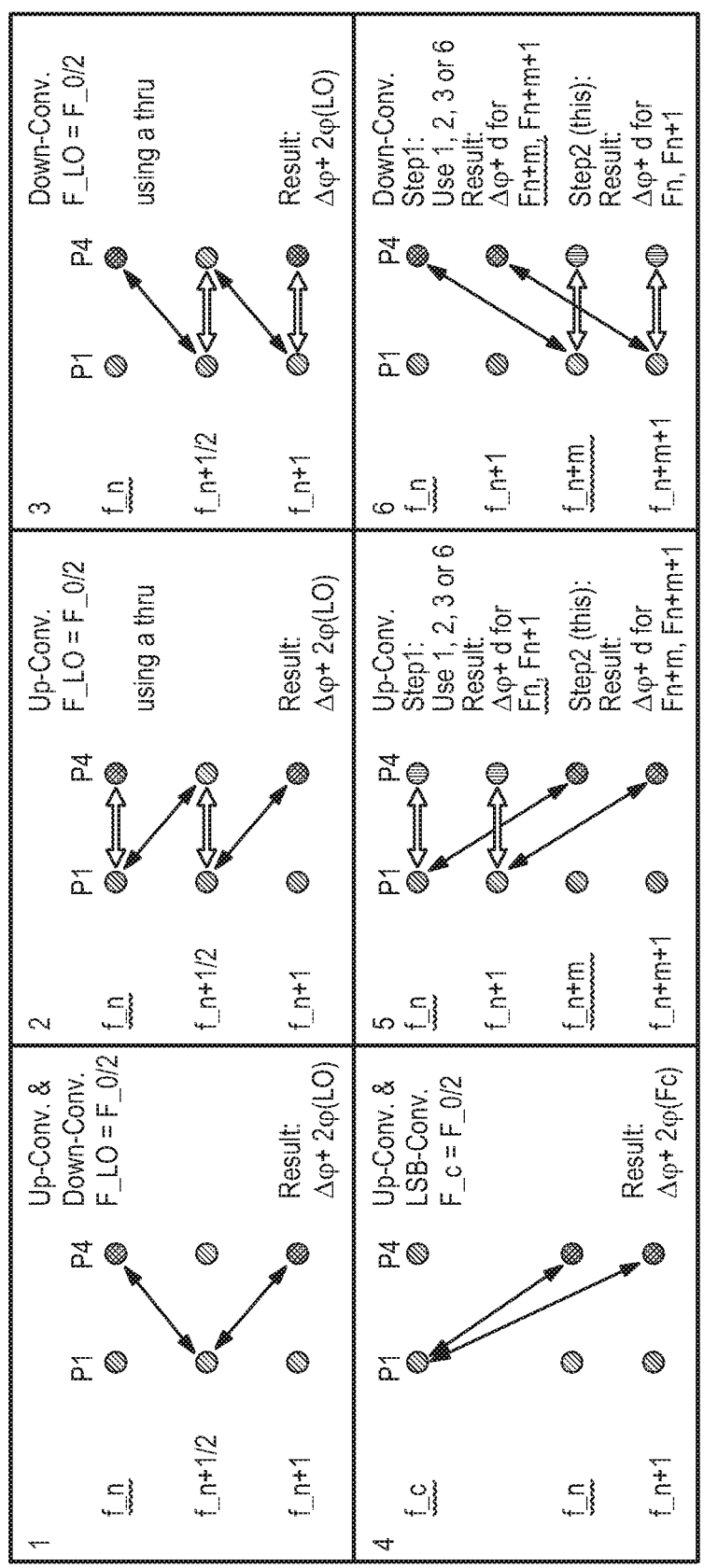
FIG. 3 schematically shows an overview illustrating different techniques applied when performing a representative method of absolute phase calibration according to the present disclosure.

In the overview shown in FIG. 3, six different techniques are illustrated in order to determine the respective phase difference used for absolute phase calibration of at least one port 18-24 of the test and measurement equipment 12, for example for determining the respective correction parameters.

In the first example indicated by "1" in FIG. 1, an up-conversion as well as a down-conversion take place such that two frequency shifts are performed while using the calibration mixer 28 and the respective local oscillator signal.

In a first UOSM measurement, a signal having a first frequency is forwarded to the calibration mixer 28 that up-converts the respective signal to a second frequency.

In a second UOSM measurement, a signal having a first frequency is forwarded to the calibration mixer 28 that down-converts the signal received into a second frequency.

Thus, two UOSM measurements are performed wherein two different frequencies are provided at the first port 18 of the test and measurement equipment 12, namely the port to be calibrated.

As shown in FIG. 3, the local oscillator signal has a frequency $f_{LO}$ that is equal to $f_{0/2}$.

The initial signal, namely the one outputted by the second port 20 of the test and measurement equipment 12 and received by the second port 32 of the calibration mixer 28, has a first frequency $f_{n+1/2}$. Hence, the first signal has a frequency that is an intermediate frequency with respect to the two different frequencies obtained at the first port 18. These frequencies are also called intended frequencies.

In some embodiments, the intended frequencies at the first port 18 relate to $f_n$ and $f_{n+1}$, whereas the first frequency is the intermediate frequency of these intended frequencies, as the first frequency relates to $f_{n+1/2}$.

The index n may be an integer, for instance 0, 1, 2, 3, 4, and so on, wherein n=0 corresponds to the fundamental, whereas n=1 corresponds to the first harmonic, and n=2 corresponds to the second harmonic and so on.

The respective harmonics and the fundamental are in relation with each other by the following equation $$f_n=(n+1)*f_0.$$

The frequency of the first harmonic (n=1) results in $$f_1=(1+1)*f_0=2*f_0,$$

whereas the frequency of the second harmonic (n=2) yields:

$$f_2=(2+1)*f_0=3*f_0.$$

Figures 4, 5:
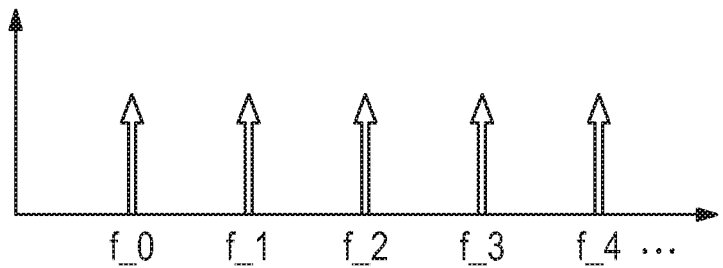
FIG. 4 shows an overview illustrating a fundamental signal and its harmonics.
FIG. 5 shows a table illustrating correction parameters determined by a representative method of absolute phase calibration according to the present disclosure.

This is also illustrated in FIG. 4. In some embodiments, equidistant signals are obtained, wherein these signals are spaced by the frequency of the fundamental, namely $f_0$.

For the different frequencies, namely the one of the fundamental and its harmonics, the respective phases at the first port 18 of the test and measurement equipment 12, namely the port to be calibrated, are determined. Therefore, the intended frequencies at the first port 18 relate to $f_n$ and $f_{n+1}$, namely the ones of the fundamental ($f_0$) and its harmonics ($f_1$, $f_2$, and so on).

From the combination of the phase measurements at the first port 18, it is possible to determine the respective phase difference for a pair of (subsequent) signals with respect to their frequencies, namely $f_n$ and $f_{n+1}$.

The (subsequent) frequencies may relate to the one of the fundamental and the first harmonic or rather to the ones of two subsequent harmonics.

The phase difference obtained is also shown in the first example of FIG. 3, in which the respective result is indicated.

Using the phase difference(s) determined by the respective method, the phase correction terms for each frequency can be calculated in a simple manner, as explained hereinafter.

As shown in the first example of FIG. 3, the phase difference is $$\Phi(n)=\Delta\varphi(n)+2\varphi(LO),$$

wherein $2\varphi(LO)$ is an offset that does not depend on n in contrast to $\Phi$ and $\Delta\varphi$. Accordingly, the above-mentioned equation can be generalized as follows $$P(n)=Dp(n)+d,$$

wherein P(n) corresponds to generalized $\Phi$, Dp(n) corresponds to generalized $\Delta\varphi$ and d corresponds to generalized $2\varphi(LO)$.

In some embodiments, all properties depending on n can be removed from the measured phase differences besides the phase difference at the first port 18, namely the one to be calibrated, since d is an offset that does not depend on n.

Then, the respective phase correction terms for each frequency can be calculated by the following equation $$p(f_n) = \sum_{m=0}^{n} (m*P(m)) = \sum_{m=0}^{n} (Dp(m)) + n*d.$$

Accordingly, the phase correction term for the fundamental relates to $$p(f_0)=0.$$

The phase correction term for the first harmonic relates to $$p(f_1) = \sum_{m=0}^{1} (m * P(m)) = \sum_{m=0}^{1} (Dp(m)) + 1 * d = Dp(01) + d,$$

wherein $Dp(01)$ may also be labelled as $\Delta\varphi_{01}$.

The phase correction term for the second harmonic relates to $$p(f_2) = \sum_{m=0}^{2} (m * P(m)) = \sum_{m=0}^{2} (Dp(m)) + 2 * d = Dp(01) + Dp(12) + 2 * d,$$

wherein $Dp(01)$ and $Dp(12)$ may also be labelled as $\Delta\varphi_{01}$ and $\Delta\varphi_{12}$, respectively.

The respective phase correction terms are also shown in FIG. 5 for the different frequencies.

Again, the phase correction terms also comprise the linear offset $n*d$, which is irrelevant for the respective calibration.

In the second example shown in FIG. 3, which is labelled with "2", the through 42 is interconnected between the first port 18 and the second port 20 of the test and measurement equipment 12 in a second setup.

As shown in the second example of FIG. 3, four UOSM measurements are performed.

In a first step, a signal with a first frequency $f_n$ is outputted at the second port 20 of the test and measurement equipment 12 that is forwarded via the through 42 to the first port 18 to be calibrated.

In a second step, the calibration mixer 28 may be interconnected between the first port 18 and the second port 20 of the test and measurement equipment 12 instead of the through 42 such that a frequency-converting measurement can be performed.

In some embodiments, an up-conversion (frequency shift) is done by means of the calibration mixer 28, as the signal with the first frequency $f_n$ is forwarded to the calibration mixer 28 that also receives the local oscillator signal with the local oscillator frequency $f_{LO}$ that is equal to $f_{0/2}$. The first frequency signal is up-converted to an intermediate frequency of $f_{n+1/2}$ due to the local oscillator signal provided.

In a third step, the through 42 is interconnected between the first port 18 and the second port 20 of the test and measurement equipment 12 again. A second signal is outputted by the second port 20 of the test and measurement equipment 12, wherein this second signal has a frequency that equals the intermediate frequency of $f_{n+1/2}$ obtained in step 2 at the first port 18. The second signal is forwarded via the through 42 to the first port 18. Hence, the second signal has a frequency that corresponds to the intermediate frequency obtained in the second step as mentioned above.

In a fourth step, the calibration mixer 28 is interconnected between the first port 18 and the second port 20 of the test and measurement equipment 12 again. The second signal having the intermediate frequency $f_{n+1/2}$ known from steps 2 and 3 is forwarded to the calibration mixer 28 that up-converts the respective signal to a second frequency $f_{n+1}$.

Thus, two different frequencies are obtained at the first port 18 to be calibrated, namely $f_n$ and $f_{n+1}$. These different frequencies relate to a pair of (subsequent) frequencies.

In the third example shown in FIG. 3, which is indicated by "3", a substantially similar calibration procedure is shown with respect to the second example indicated by "2".

In some embodiments, the calibration mixer 28 is used to down-convert the respective signals received in contrast to up-converting the signals as shown in the second example. However, two different frequencies are also obtained at the first port 18 to be calibrated, namely $f_n$ and $f_{n+1}$.

In the fourth example shown in FIG. 3, which is indicated by "4", an up-conversion and lower sideband-conversion take place, also called LSB-mixing. As shown in the fourth example, two different frequencies are provided at the first port 18 to be calibrated that correspond to $f_n$ and $f_{n+1}$.

The resulting phase difference obtained differs from the ones previously obtained, as the offset is different. In some embodiments, the offset is based on $f_c$ that equals $f_{1/2}$. Accordingly, the respective local oscillator signal used in the fourth example is different to the previous ones.

In the fifth example and the sixth example shown in FIG. 3, which are labelled with "5" and "6", it is illustrated how further phase differences for other frequency pairs can be calculated based on the previous ones.

In some embodiments, both procedures are based on any of the procedures shown in examples 1 to 4. Thus, the phase difference for a certain frequency pair ($f_n$, $f_{n+1}$ or $f_{n+m}$, $f_{n+m+1}$) are already obtained previously by at least one of the examples discussed previously.

In the next steps, respective up-conversions (frequency shifts) or down-conversions (frequency shifts) are performed in order to obtain the respective absolute phase calibration for lower or higher frequency pairs, as indicated in examples 5 and 6 in FIG. 3.

In any of the examples shown, at least two different UOSM measurements are performed, wherein a frequency shift is performed by means of the calibration mixer 28 and the local oscillator signal provided.

In general, a calibration method ensuring absolute phase calibration of a network analyzer, for example a vector network analyzer, is provided by of the calibration mixer 28. The calibration mixer 28 used may be reciprocal, which ensures that the calibration mixer 28 can be used in both directions.

In some embodiments, at least two different UOSM measurements are used and combined with each other in order to remove all properties depending on n from the respective measured phase difference besides the phase difference at the first port 18 to be calibrated.

Certain embodiments disclosed herein utilize circuitry (e.g., one or more circuits) in order to implement protocols, methodologies or technologies disclosed herein, operably couple two or more components, generate information, process information, encode signals, decode signals, transmit and/or receive signals, etc. Circuitry of any type can be used. For example, as described above, the calibration system 10, the measurement equipment 12, the internal measurement and analyzing components 16, the calibration mixer 28 or other components of the system may include, in some embodiments, logic for implementing the technologies and methodologies described herein. This logic of these components can be carried out in circuitry that includes hardware or a combination of hardware and software. In some embodiments, logic of these components is carried out in software.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, circuitry includes one or more ASICs having a plurality of predefined logic components. In an embodiment, circuitry includes one or more FPGA having a plurality of programmable logic components. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

In an embodiment, circuitry includes a baseband integrated circuit or applications processor integrated circuit or a similar integrated circuit in a server, a broadcast/streaming device, such as for example a cellular network device, an OTA network device, an OTT network device, a satellite network device, an internet protocol device, etc., and other network devices, or other computing devices. In an embodiment, circuitry includes one or more remotely located components. In an embodiment, remotely located components are operably coupled via wireless communication. In an embodiment, remotely located components are operably coupled via one or more receivers, transmitters, transceivers, or the like.

In an embodiment, circuitry includes one or more memory devices that, for example, store instructions or data. Non-limiting examples of one or more memory devices include volatile memory (e.g., Random Access Memory (RAM), non-volatile memory (e.g., Read-Only Memory (ROM), or the like. The one or more memory devices can be coupled to, for example, one or more computing devices by one or more instructions, data, or power buses. In an embodiment, circuitry may also include a computer-readable media drive configured to accept signal-bearing medium (e.g., computer-readable memory media, computer-readable recording media, or the like). In an embodiment, a program for causing a system or device to execute any of the disclosed methods can be stored on, for example, a computer-readable recording medium (CRMM), a signal-bearing medium, or the like.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" means "A and/or B", namely "A" alone, "B" alone or "A and B". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of absolute phase calibration of at least a first port of a test and measurement equipment, comprising:
   providing said test and measurement equipment having said first port to be calibrated;
   providing a calibration mixer having a first port, a second port and a local oscillator port;
   providing at least one phase reproducible source that outputs a local oscillator signal; and
   performing at least two Unknown through-Open-Short-Match (UOSM) measurements at said first port of said test and measurement equipment, wherein at least one of said at least two UOSM measurements is performed with a frequency shift from a first frequency to a second frequency by using said calibration mixer;
   wherein said first port of said calibration mixer is connected with said first port of said test and measurement equipment and said local oscillator port of said calibration mixer is connected with said at least one phase reproducible source.

2. The method according to claim 1, wherein a phase difference is determined based on said at least two UOSM measurements.

3. The method according to claim 1, wherein at least one of up-conversion, down-conversion and LSB-mixing is done when performing the frequency shift.

4. The method according to claim 1, wherein said frequency shift is realized by using said calibration mixer and said local oscillator signal.

5. The method according to claim 1, wherein at least two different frequencies are used during said at least two UOSM measurements at said first port to be calibrated.

6. The method according to claim 1, wherein frequency shifts are performed during said at least two UOSM measurements, and wherein said frequency shifts performed relate to an up-conversion and a down-conversion, respectively.

7. The method according to claim 1, wherein a through is connected to said first port to be calibrated of said test and measurement equipment.

8. The method according to claim 7, wherein said through is used for non-frequency converting measurements.

9. The method according to claim 1, wherein said calibration mixer is reciprocal at least for frequencies used for absolute phase calibration.

10. The method according to claim 1, wherein said test and measurement equipment comprises said at least one phase reproducible source.

11. The method according to claim 1, wherein said test and measurement equipment is a vector network analyzer.

12. A calibration system for absolute phase calibration, comprising:
- a test and measurement equipment having a first port to be calibrated,
- a calibration mixer having a first port, a second port and a local oscillator port,
- at least one phase reproducible source that outputs a local oscillator signal,
- wherein said calibration system is configured to perform at least two Unknown through-Open-Short-Match (UOSM) measurements at said first port of said test and measurement equipment, wherein at least one of said at least two UOSM measurements is performed with a frequency shift from a first frequency to a second frequency by using said calibration mixer;
- wherein, in a first setup, said first port of said calibration mixer is connected with said first port of said test and measurement equipment, said second port of said calibration mixer being connected with a second port of said test and measurement equipment, and said local oscillator port of said calibration mixer being connected with said phase reproducible source integrated in said test and measurement equipment.

13. The calibration system according to claim 12, wherein, in a second setup, a through is interconnected between said first port of said test and measurement equipment and a second port of said test and measurement equipment.

14. A calibration system for absolute phase calibration, comprising:
- a test and measurement equipment having a first port to be calibrated,
- a calibration mixer having a first port, a second port and a local oscillator port,
- at least one phase reproducible source that outputs a local oscillator signal,
- wherein said calibration system is configured to perform at least two Unknown through-Open-Short-Match (UOSM) measurements at said first port of said test and measurement equipment, wherein at least one of said at least two UOSM measurements is performed with a frequency shift from a first frequency to a second frequency by using said calibration mixer;
- wherein said first port of said calibration mixer is connected with said first port of said test and measurement equipment and said local oscillator port of said calibration mixer is connected with said at least one phase reproducible source.

* * * * *